APPARATUS FOR DEPOSITING SEMICONDUCTOR MATERIAL AND FORMING SEMICONDUCTOR JUNCTIONS

Original Filed July 7, 1966

INVENTOR.
MURRAY BLOOM
BY
Donald C Keaveney
ATTORNEY 3,573,190

APPARATUS FOR DEPOSITING SEMICONDUCTOR MATERIAL AND FORMING SEMICONDUCTOR JUNCTIONS

Murray Bloom, Los Angeles, Calif., assignor to TRW Inc., Redondo Beach, Calif.

Original application July 7, 1966, Ser. No. 563,467, now Patent No. 3,480,535, dated Nov. 25, 1969. Divided and this application Oct. 31, 1968, Ser. No. 772,231
Int. Cl. C23c *15/00*
U.S. Cl. 204—298 4 Claims

ABSTRACT OF THE DISCLOSURE

There is disclosed an apparatus for sputter depositing a layer of semiconductor material from a cathode onto a semiconductor substrate through a molten metal alloy layer on the substrate. Means are provided to sense the temperature of the substrate in order to control means for shielding the alloy layer until the substrate reaches a temperature such that the surface of the substrate itself is slightly below the melting point of the material to be deposited whereas the surface of the molten layer is maintained by the sputtering apparatus at a temperature which is above the melting point of the material to be sputter deposited. The apparatus thus assures that the sputtered material will dissolve into the alloy at its high temperature surface and crystallize out onto the surface of the substrate.

BACKGROUND OF THE INVENTION

This is a division of application Ser. No. 563,467; filed July 7, 1966 now U.S. Pat. No. 3,480,535 of Nov. 25, 1969.

This invention relates generally to apparatus for fabricating semiconductor devices and more particularly to improvements facilitating the deposition of epitaxial layers of semiconductor material useful, for example, for forming semiconductor junctions.

Various methods are known in the prior art suitable for depositing epitaxial layers of semiconductor material, e.g. silicon. Although many of these methods are suitable for certain applications, they are often unsatisfactory for other applications. For example, in the formation of junctions between different types of silicon, it is usually desired to control diffusion. If the heat required by the deposition method is too great, unwanted diffusion may result. Aside from temperature considerations, prior art methods are often unsatisfactory because they require the use of extremely expensive equipment, for example, in order to develop extremely high vacuums.

In accordance with a first aspect of the present invention, an improved apparatus for implementing a method for depositing epitaxial layers of semiconductor material, such as silicon, is provided which method involves sputtering silicon from a cathode and depositing onto a substrate through a molten alloy layer (e.g. gold-silicon eutectic) supported on the substrate. By maintaining a temperature gradient through the alloy layer, silicon will be grown adjacent the cooler side of the alloy layer as silicon is added (by sputtering) to its hotter side.

In accordance with a second aspect of the invention, it is recognized that junctions can be formed by depositing a first type of material through a liquid alloy layer onto a substrate of another material type. Although, in accordance with the preferred method of practicing the invention, junctions are formed by depositing by sputtering, it is pointed out that other methods of deposition (e.g. sublimation, reduction, evaporation) can be used to form junctions by depositing through a liquid alloy layer.

The novel features that are considered characteristic of this invention are set forth with particularity in the appended claims. The invention will best be understood from the following description when read in connection with the accompanying drawings, in which:

Figure 1:
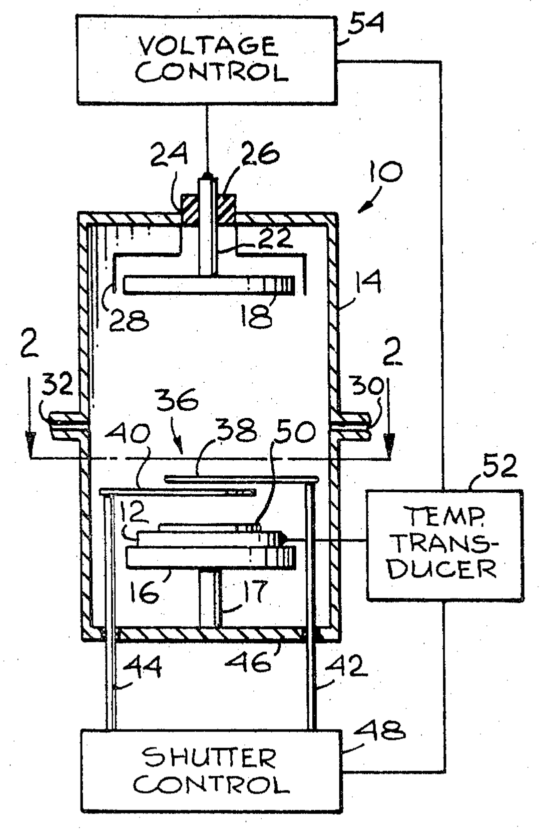
FIG. 1 is a sectional view illustrating a sputtering apparatus in accordance with the present invention.

Attention is now called to FIG. 1 which illustrates a sectional view of a sputtering apparatus 10 suitable for depositing semiconductor material, such as silicon, onto a substrate 12 supported within the apparatus 10. Typically, but not necessarily, the substrate 12 is formed of semiconductor material such as silicon.

More particularly, the sputtering apparatus 10 is comprised of a cylindrical housing or chamber 14 formed of a conductive material, for example, aluminum. An anode 16 is supported within and electrically connected to the housing by a conductive stem 17. A cathode 18 is also disposed in the housing spaced from and opposed to the anode 16. The cathode is formed of a material of the conductivity type and resistivity desired to be deposited on the substrate. A conductive stem 22 physically and electrically connected to the cathode 18, extends through an opening 24 in the end wall of the housing 14. The stem 22 is insulated from the housing 24 by a vacuum-tight insulating collar 26. A portion 28 of the housing projects inwardly around the cathode 18 to shield the cathode and stem 22.

In addition with the foregoing, the housing 14 is provided with an inlet aperture 30 and an exhaust aperture 32. The exhaust aperture 32 is used to evacuate the housing. The inlet aperture 30 is used to enable gas to be leaked into the housing.

The suputtering apparatus 10 described thus far is substantially conventional. In order to use the sputtering apparatus 10 to practice the method in accordance with the present invention, the apparatus is provided with a shutter mechanism 36 disposed between the anode 16 and cathode 18, preferably close to where the substrate is to be supported. The shutter mechanism 36 is comprised of overlapping plates 38 and 40 which can be respectively mounted on rotatable shafts 42 and 44. The shafts 42 and 44 are journalled through the wall 46 of the sputtering chamber and are controlled by a shutter control apparatus 48. Thus, the shutter mechanism 36 can either be in a closed position so that it shields the substrate 12 from the cathode 18 or in an open position so that it is exposed to the cathode 18.

It has long been known that certain semiconductor materials, e.g. silicon, can be grown at the cooler surface of a molten layer of certain eutectics, in response to that material being added to the hotter surface of the eutectic. In accordance with a preferred form of the invention, silicon released by sputtering from a silicon cathode is deposited onto the substrate 12 through a gold-silicon eutectic.

More particularly, in order to deposit an epitaxial layer of silicon onto the substrate, a layer of metal 50 capable of alloying with the substrate mtaerial is affixed thereto. Assuming the substrate material to be silicon, various metals including gold, silver, copper, indium, tin, aluminum, and other metals can be employed. The layer 50 can be very thin, e.g. on the order of 1500 A.

Figure 2:
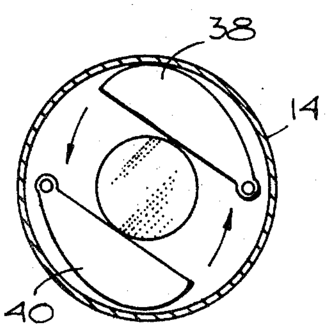
FIG. 2 is a sectional vew taken substantially along the plane 2—2 of FIG. 1.
Figures 3A, 3B, 3C, 3D, 3E, 3F:
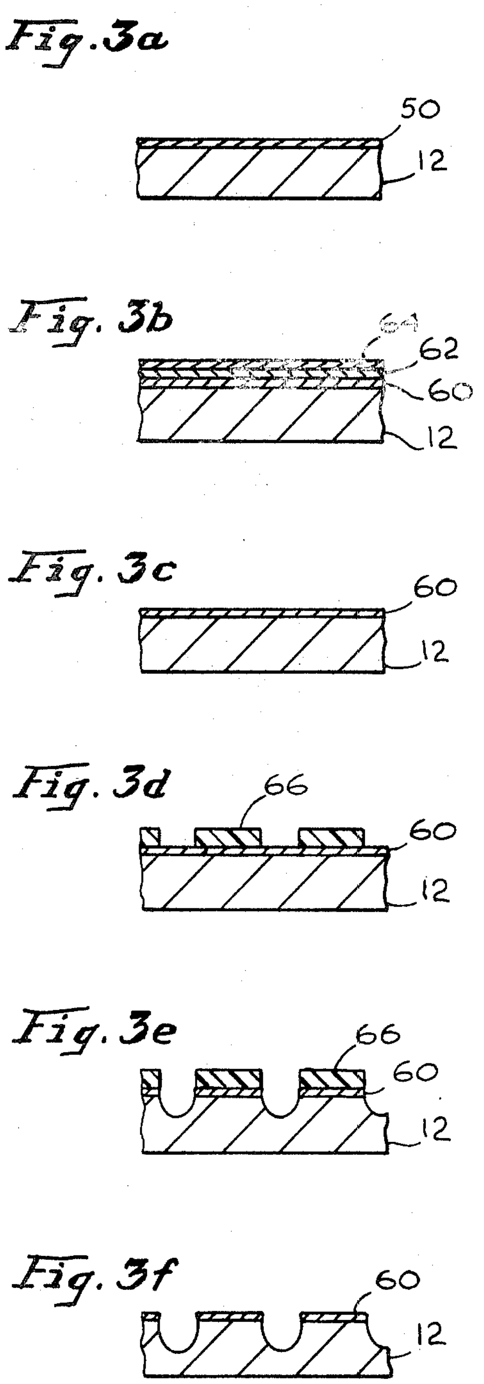
FIG. 3 schematically illustrates various steps in practicing the fabrication method in accordance with the present invention.

In order to appreciate how the apparatus 10 of FIGS. 1 and 2 is utilized to deposit an epitaxial silicon layer on the substrate 12, attention is called to FIG. 3 which illustrates a sequence of fabrication steps. FIG. 3(*a*) comprises a cross-section of the silicon substrate 12 illustrating a thin gold layer 50 thereon. The gold 50 can be deposited on the silicon substrate 12 by sputtering from a gold cathode utilizing a pressure of approximately 200 microns for one hour at 400–460° C. In order to form an epitaxial silicon layer on the substrate 12, the substrate with the gold layer 50 thereon is supported between the cathode 18 and anode 16; e.g. on the anode 16 as shown in FIG. 1. Then, utilizing a silicon cathode and with the shutter mechanism 36 initially closed to shield the metal layer 50 from the cathode, an electrical potential on the order of 5000 volts is applied between the anode and cathode. Assuming an appropriate gas pressure within the sputtering chamber, a discharge will be established which heats the gas within the chamber which in turn of course heats the substrate 12. A temperature transducer 52 monitors the substrate temperature (which is approximately the same as the alloy temperature) and when it reaches a value (e.g. 400° C., for a gold silicon alloy) sufficient to form a molten alloy layer, the transducer 52 operates the shutter control 48 to thereby open the shutter mechanism 36. As a consequence, silicon atoms sputtered from the cathode will be collected on the upper surface (i.e. the surface closest to the cathode of the molten alloy layer). Inasmuch as the aluminum anode 16 and stem connecting it to the chamber wall 14 act as a heat sink, there will be a temperature gradient through the molten alloy layer such that its lower surface adjacent the substrate 12 will be cooler than its upper surface. As a consequent, silicon will be grown at the boundary between the alloy layer and the substrate 12 as shown in FIG. 3(*b*).

In addition to controlling the shutter control 48, the temperature transducer 52 controls a voltage control device 54 to maintain the substrate temperature at a constant value, e.g. 400° C., during the deposition of silicon.

As a consequence of depositing silicon in the manner aforedescribed, the substrate 12, as shown in FIG. 3(*b*), will have an epitaxial silicon layer 60 formed on one surface thereof with a gold silicon eutectic 62 thereover with a layer of gold 64 on top of the eutectic. By then soaking the structure of FIG. 3(*c*) in aqua regia for a sufficient period (e.g. 15 hours), the gold layer 64 and gold silicon eutectic 62 will be removed leaving only the epitaxial silicon layer 60 on the substrate 12 as shown in FIG. 3(*c*). A mask 66, which can be formed of a photoresist material, is then deposited over the epitaxial silicon layer 60 in the deisred pattern as shown in FIG. 3(*d*). Then, utilizing an appropriate etchant, the substrate can be etched in order to form mesas as shown in FIG. 3(*e*). Subsequently, a solvent can be employed to remove the photoresist mask to provide the structure as shown in FIG. 3(*f*). It can be noted in FIG. 3(*f*) that a plurality of mesas are defined which are structurally interconnected by thin portions of the substrate. These thin portions can be easily severed by various means to thus provide a plurality of individual semiconductor devices.

Utilization of the apparatus of FIG. 1 in the manner described deposits an epitaxial layer of silicon of the resistivity and conductivity type corresponding to the silicon cathode on the upper surface of the substrate. Experiments indicate that the method and apparatus of FIG. 1 enables silicon of any type to be desposited on substrates of various materials including all types of silicon.

It is significant to note that by utilizing a substrate of one type of silicon material and a cathode of another type of silicon material, silicon junctions can be formed. More particularly, a PN junction can be formed for example by utilizing a P type substrate and a cathode formed of N type silicon. It has been found that junctions formed in this manner exhibit excellent electrical properties; for example, mesas formed in accordance with the method steps of FIG. 3, exhibit a sharp breakdown with a reverse voltage of 70 volts. Reverse current at just less than 70 volts was less than one microampere. Forward conduction commenced at approximately .6 volt.

Because of the relatively low temperature and short time required to deposit silicon according to the aforedescribed method, very little diffusion takes place and hence the method appears to be well suited to the fabrication of plane emitters for example. If conventional epitaxial deposition by the reduction of a silane were used, the high temperatures required would result in a certain amount of diffusion thereby adversely affecting the formation of a plane emitter.

From the foregoing, it should be appreciated that a method of fabricating an epitaxial layer of silicon by sputtering a silicon cathode and depositing the sputtered silicon through a molten alloy layer has been disclosed herein. The method in accordance with the invention has several characteristics which make it attractive as compared to other prior art methods. Primarily, it requires only relatively moderate temperatures of between 400° C. and 500° C., and only moderate vacuums of approximately 200 millitorr. As a consequence of these characteristics, it is particularly attractive for forming semiconductor junctions since the absence of very high temperatures avoids problems of unwanted diffusion. Although sputtering in accordance with the invention represents a preferred manner of forming junctions, it is recognized that junctions can be formed by depositing silicon through a molten alloy layer wherein the silicon is liberated from the cathode by means other than sputtering, e.g. sublimation, reduction, evaporation.

What is claimed is:

1. An apparatus for sputter depositing a layer of material on a substrate comprising:
- an enclosed chamber;
- means for evacuating said chamber;
- means for providing an ionizable gas to said chamber;
- a cathode supported in said chamber;
- an anode supported in said chamber;
- said substrate contiguous to and substantially coextensive with said anode;
- means for sensing the temperature of said substrate;
- means for applying a potential across said anode and cathode sufficient to cause sputter deposition of said cathode upon said substrate;
- means responsive to the temperature of said substrate for shielding said anode and substrate from said cathode until the temperature of said substrate reaches a predetermined value; and
- means responsive to the temperature of said substrate for adjusting the potential across said anode and cathode to maintain the temperature of said substrate at a predetermined value.

2. An apparatus as claimed in claim 1 wherein said means for shielding said anode and substrate from said cathode comprise:
- first and second rotatable shafts journaled through the wall of said enclosed chamber;
- first and second overlapping plates mounted on the ends of said shafts within said enclosed chamber; and
- means for rotating said shafts in response to the means responsive to the temperature of said substrate; so that
- as the shafts are rotated in a first direction said plates move to shield said anode and substrate from said cathode, and as the shafts are rotated in the opposite direction said plates move to expose said anode and substrate to said cathode.

3. In a sputter depositing apparatus of the type having an enclosed chamber, means for evacuating said chamber, means for providing an ionizable gas to said chamber, a cathode supported in said chamber, an anode supported in said chamber, said substrate contiguous to and substantially coextensive with said anode, means for sensing the temperature of said substrate, and means for applying a potential across said anode and cathode sufficient to cause sputter deposition of said cathode upon said substrate, the improvement comprising:
- means responsive to the temperature of said substrate for adjusting the potential across said anode and cathode to maintain the temperature of said substrate at a predetermined value; and means responsive to the temperature of said substrate for shielding said anode and substrate from said cathode until the temperature of said substrate reaches a predetermined value.

4. An apparatus as claimed in claim 1 wherein said means for shielding said anode and substrate from said cathode comprise:

first and second rotatable shafts journaled through the wall of said enclosed chamber;

first and second overlapping plates mounted on the ends of said shafts within said enclosed chamber; and means for rotating said shafts in response to the means responsive to the temperature of said substrate; so that as the shafts are rotated in a first direction said plates move to shield said anode and substrate from said cathode, and as the shafts are rotated in the opposite direction said plates move to expose said anode and substrate to said cathode.

References Cited

UNITED STATES PATENTS

| | | | |
|---|---|---|---|
| 3,303,117 | 2/1967 | Flur | 204—298 |
| 3,369,989 | 2,1968 | Kay et al. | 204—298 |
| 3,330,752 | 7/1967 | Hallen et al. | 204—298 |

JOHN H. MACK, Primary Examiner

S. S. KANTER, Assistant Examiner